United States Patent
Fujii et al.

(10) Patent No.: US 7,150,792 B2
(45) Date of Patent: Dec. 19, 2006

(54) FILM DEPOSITION SYSTEM AND FILM DEPOSITION METHOD USING THE SAME

(75) Inventors: Hirofumi Fujii, Takasago (JP); Tadashi Kumakiri, Takasago (JP); Katuhiko Shimojima, Takasago (JP)

(73) Assignee: Kobe Steel, Ltd., Kobe (JP)

( * ) Notice: Subject to any disclaimer, the term of this patent is extended or adjusted under 35 U.S.C. 154(b) by 240 days.

(21) Appl. No.: 10/681,345

(22) Filed: Oct. 9, 2003

(65) Prior Publication Data

US 2004/0074445 A1  Apr. 22, 2004

(30) Foreign Application Priority Data

Oct. 15, 2002  (JP)  ............... 2002-300864

(51) Int. Cl.
C23C 16/00 (2006.01)
C23C 13/08 (2006.01)
B05D 3/06 (2006.01)

(52) U.S. Cl. .............. 118/726; 204/298.09; 204/298.28

(58) Field of Classification Search ........... 118/723 E, 118/723 DC, 726, 724, 730, 719; 219/121.15; 204/298.09, 298.12, 298.26, 298.27, 298.28, 204/192.38; 427/398.1–398.4, 569, 580
See application file for complete search history.

(56) References Cited

U.S. PATENT DOCUMENTS 5,380,420 A * 1/1995 Tsuji .................... 204/298.41
5,439,715 A * 8/1995 Okamura et al. ........... 427/575
5,660,740 A * 8/1997 Komino ...................... 216/67
5,730,847 A * 3/1998 Hanaguri et al. ...... 204/298.41
5,976,636 A * 11/1999 Leu et al. .................... 427/531
6,224,726 B1   5/2001 Beers et al.
6,231,726 B1   5/2001 Suemitsu et al.
6,335,281 B1 * 1/2002 Segi et al. .................. 438/680
2003/0051667 A1 * 3/2003 Tamagaki ................... 118/726

FOREIGN PATENT DOCUMENTS

| GB | 1004739 | 9/1965 |
| JP | 57-203770 | 12/1982 |
| JP | 8-262250 | 10/1996 |
| JP | 2001-226771 | 8/2001 |
| JP | 2002-124471 | 4/2002 |

* cited by examiner

*Primary Examiner*—Parviz Hassanzadeh
*Assistant Examiner*—Sylvia R. MacArthur
(74) *Attorney, Agent, or Firm*—Oblon, Spivak, McClelland, Maier & Neustadt, P.C.

(57) ABSTRACT

The present invention provides a film deposition system capable of effectively cooling a work having a large volume, and a film deposition method using this system. The film deposition system has, within a vacuum chamber 1, an evaporation source 3 for forming a film on a work 2 and a cooling device 4 for cooling the work 2, characterized in that the work 2 has an internal space 15 communicating with the outside through an opening part 14, and the cooling device 4 is insertable to and drawable from the internal space 15 through the opening part 14 of the work 2 to cool the work 2 from the inside.

11 Claims, 6 Drawing Sheets

FILM DEPOSITION SYSTEM AND FILM DEPOSITION METHOD USING THE SAME

BACKGROUND OF THE INVENTION

1. Field of the Invention

The present invention relates to a film deposition system used for abrasion resisting coating treatments for cutting tools, mechanical parts, and the like, and a film deposition method using this system.

2. Description of the Related Art

As a technique for coating the surface of a work such as cutting tool or mechanical part with an abrasion resisting material, physical vapor deposition (PVD method) is known. In vacuum arc deposition method as such a PVD method, a high deposition rate necessarily increases the heat input to the work, and the temperature is apt to rise. Therefore, a technique for cooling the work (substrate) was required.

As work cooling devices of this type, for example, a one provided with a cooling pipe within a stage for placing a work to cool the work (refer to Japanese Published Unexamined Patent Application No. 8-262250) or a one for cooling a work by a heat transfer means through a tray for placing the work (refer to Japanese Published Unexamined Patent Application No. 2001-226771) are known.

Further, it is also known a film deposition system for performing the film deposition treatment of a substrate to be treated held in a vacuum chamber, the system having, within the vacuum chamber, a holder holding part rotatable around a revolving shaft, a substrate holder held around the revolving shaft by the holder holding part and rotatable around a rotating shaft, a rotary drive part for rotating the holder holding part and the substrate holder, and a cooling part for cooling the substrate to be treated held by the substrate holder (refer to Japanese Published Unexamined Patent Application No. 2002-124471).

Each of the above-mentioned conventional work cooling devices is effective for a flat work because of the mechanism of cooling the work from one outer surface thereof, but cannot effectively cool a work having a complicated shape such as cutting tool, mechanical part or automotive part, or a work with a large volume which has a prescribed thickness (height) to the cooling face.

SUMMARY OF THE INVENTION

In view of the problems noted above, the present invention provides a film deposition system capable of effectively cooling a work having a large volume, and a film deposition method using this system.

Namely, the film deposition system according to the present invention comprises a vacuum chamber, and an evaporation source for forming a film on a work in the vacuum chamber and a cooling device for cooling the work, which are provided within the vacuum chamber, and is characterized in that the work has an internal space communicating with the outside through an opening part, and the cooling device is insertable to and drawable from the internal space through the opening part of the work to cool the work from the inside.

According to the above structure, since the work is cooled from the internal space of the work, a work having a large capacity such as cylindrical body can be effectively cooled.

The cooling device preferably has a coolant vessel for passing a coolant in the inner part thereof.

The internal space of the work may be formed in a cylindrical shape having a linear axis, and the coolant vessel is preferably formed in a cylindrical shape insertable to the internal space.

The clearance between the inside surface of the work and the outside surface of the coolant vessel is preferably set to 100 mm or less.

The film deposition system may have a work holding device for attachably and detachably holding the work, and the work holding device preferably comprises a rotating table for rotating the work around a rotating shaft that is the axis of the internal space.

The work holding device may have a moving means for moving the work separately from the rotating table, and the coolant vessel is preferably provided so as to move following the movement of the work by the moving means.

The moving means may have a revolving table rotated around a revolving shaft, and the rotating table is preferably provided on the revolving table.

The coolant vessel is preferably provided on the revolving table.

The vacuum chamber may have a bottom part to provide the revolving table on the bottom part with the revolving shaft as a vertical axis attitude, the rotating table is preferably provided on the upper surface of the revolving table to have circumferentially equal intervals on a concentric circle with the revolving shaft as center, and the coolant vessel is preferably provided on the rotating shaft center part.

The film deposition method according to the present invention is a method for performing a film deposition on a work by use of a film deposition system comprising a vacuum chamber, and an evaporation source for forming a film on the work and a cooling device for cooling the work, which are provided within the vacuum chamber, characterized in that the film is formed on the outside surface of the work while insertably and drawably inserting the cooling device into the work to cool the work from the inside of the work.

In the above-mentioned method, the work is preferably rotated and revolved in the state where the cooling device is inserted into the work.

According to the present invention, a work having a large volume can be effectively cooled.

DESCRIPTION OF THE PREFERRED EMBODIMENTS

Embodiments of the present invention will next be described with reference to the drawings.

Figure 1:
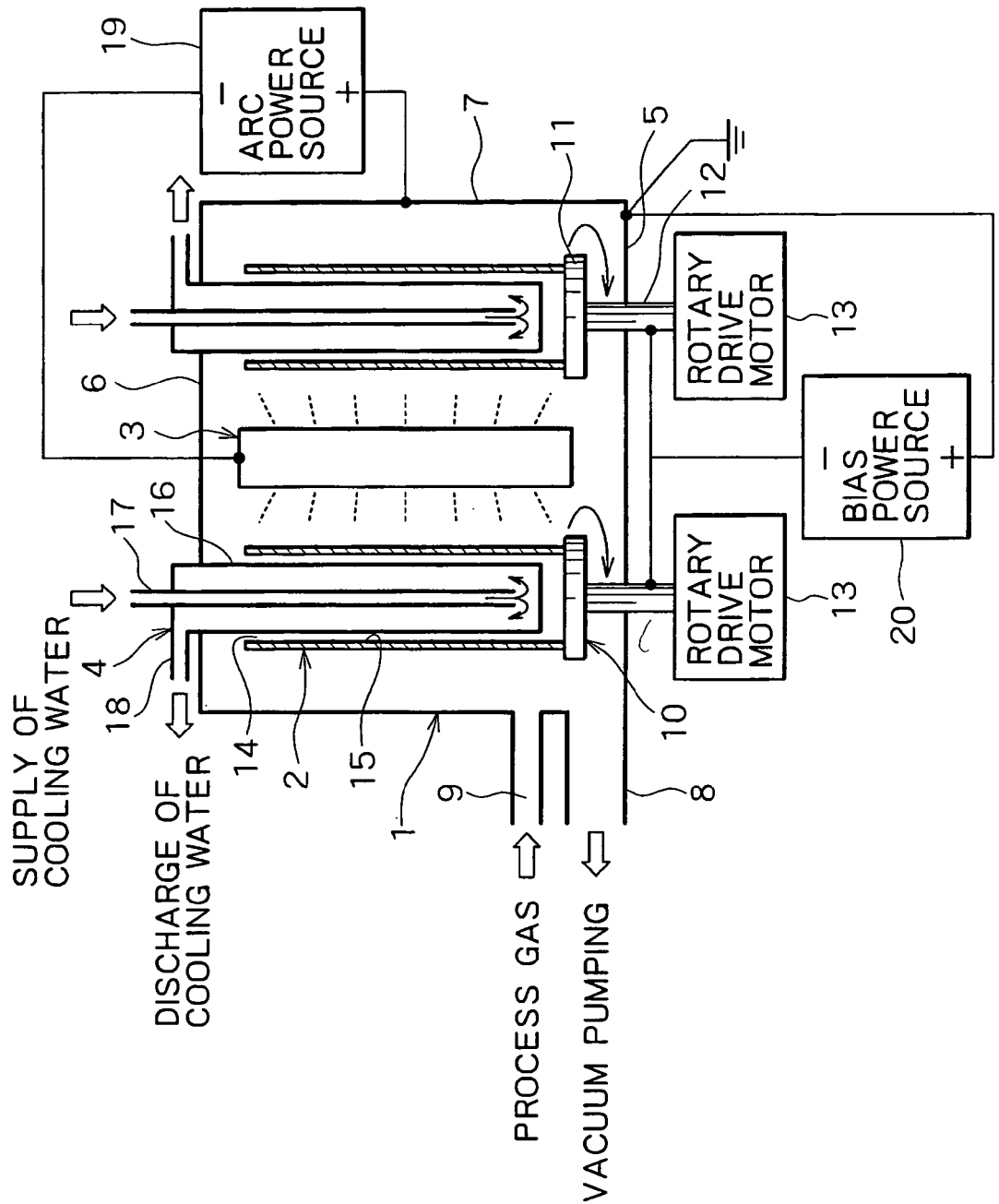
FIG. 1 is a schematic view of a film deposition system according to an embodiment of the present invention.
Figure 2:
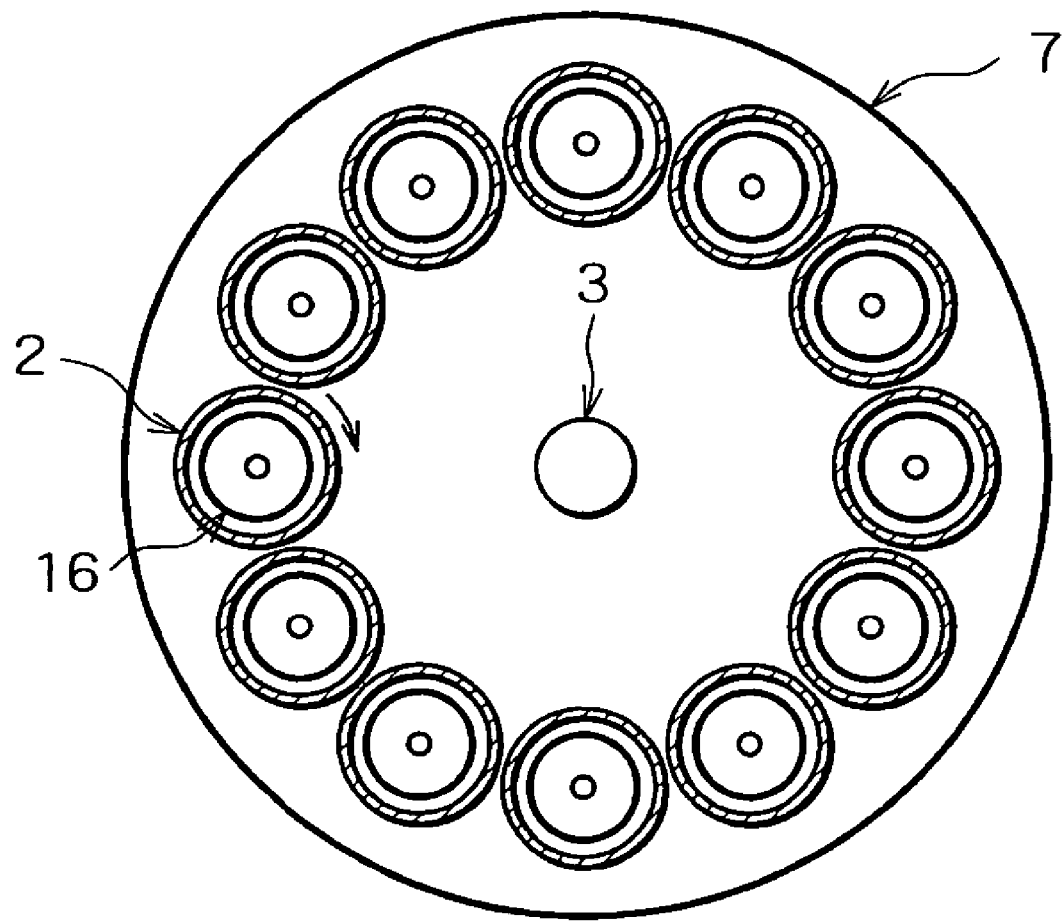
FIG. 2 is a top plane view of the system of FIG. 1.

A vacuum arc film deposition system is shown in FIGS. 1 and 2. This film deposition system has a vacuum chamber 1. An evaporation source 3 for forming a film on a work 2 attachably and detachably charged therein and a cooling device 4 for cooling the work 2 are provided within the chamber 1.

The vacuum chamber 1 is a sealed casing having a bottom part 5, a ceiling part 6, and a circumferential wall part 7. The circumferential wall part 7 is formed in a cylindrical shape having a vertical axis. An exhaust pipe 8 is connected to the vacuum chamber 1, and a vacuum pump (not shown) is connected to the exhaust pipe 8 to reduce the internal pressure of the vacuum chamber 1. One or more gas feed pipes 9 are connected to the vacuum chamber 1 to supply an inert gas or reaction gas (process gas) into the vacuum chamber 1.

The evaporation source 3 provided in the vacuum chamber 1 is a film deposition material formed in a rod shape, which is arranged in the axial center part of the vacuum chamber 1 along the vertical direction.

The vacuum chamber 1 has a work holding device 10 for holding the work 2. The holding device 10 has a plurality of rotating tables 11 arranged on the bottom part 5 of the chamber 1 to have circumferentially equal intervals on a concentric circle with the axial center of the chamber 1. Each rotating table 11 is constituted so as to place the work 2 on the upper surface. This rotating table 11 has a disc-like shape with a rotating shaft 12 fixed to the lower surface center of the disc so as to be a vertical axis, and the rotating shaft 12 is rotatably supported by the bottom part 5 of the chamber 1.

The rotating shaft 12 is rotatable by a drive means 13. The drive means 13 is provided on the outside of the vacuum chamber 1 and comprises a motor. The drive means 13 comprises motors provided every rotating shaft 12 in this embodiment, but may be constituted so as to transmit the power by one motor to each rotating shaft 12 through a gear transmission mechanism or the like.

The work 2 held by the holding device 10 has an internal space 15 communicating with the outside through an opening part 14. The internal space 15 of the work 2 is formed in a cylindrical shape having a linear axis. The outside surface of the cooling device 4 is preferably formed in a cylindrical shape concentric with the cylindrical internal space 15.

In this embodiment, the work 2 is formed of a cylinder opened at both ends. The cylindrical work 2 is fixed to the upper surface of the rotating table 11 so that its axis is matched to the axis of the rotating shaft 12.

The cooling device 4 provided in the vacuum chamber 1 is insertable to and drawable from the internal space 15 through the opening part 14 of the work 2 to cool the work 2 from the inside. The cooling device 4 has a coolant vessel 16 for passing a coolant in the inner part. The coolant vessel 16 is formed in a cylindrical shape insertable to the cylindrical internal space 15 of the work 2.

In this embodiment, the coolant vessel 16 is cylindrically formed so as to be insertable to and drawable from the internal space 15 through the upper end opening part 14 of the cylindrical work 2. The cylindrical coolant vessel 16 is vertically movably provided, in opposition to each rotating table 11, on the ceiling part 6 of the vacuum chamber 1 above it. The ceiling part 6 is sealed to the coolant vessel 16 through a seal member (not shown).

A coolant supply pipe 17 and a discharge pipe 18 are connected to the coolant vessel 16 out of the vacuum chamber 1 to efficiently circulate the coolant in the coolant vessel 16. As the coolant, for example, cooling water is used.

The clearance between the inside surface of the work and the outside surface of the coolant vessel 16 is set to 100 mm or less, desirably, 30 mm or less. The both may be perfectly closely fitted to each other, but are more desirably arranged with a slight clearance because thermal contraction can be absorbed, and workability is also enhanced.

The film deposition system further has an arc power source 19 and a bias power source 20, the cathode of the arc power source 19 is connected to the evaporation source 3, and the evaporation source 3 is constituted as a target (cathode). The anode of the arc power source 19 is connected to the vacuum chamber 1. The work 2 is connected to the cathode of the bias power source 20.

The arc power source 19 has an auxiliary anode for spark discharge (not shown) to generate an arc between the auxiliary anode and the target 3.

The film deposition method using a film deposition system having the above structure is then described.

The cylindrical works 2 are inserted into the vacuum chamber 1, placed on the rotating table 11, and fixed concentrically with the rotating shafts 12. The coolant vessels 16 of the cooling device 4 are lowered and inserted to the internal spaces 15 of the works 2. The vacuum chamber 1 is evacuated, and a process gas is supplied thereto to keep the chamber 1 in a prescribed pressure reduced state.

The arc power source 19 is driven to generate the arc in the evaporation source 3, and a cathode material is evaporated and ionized from the evaporation source 3. This is reacted with the process gas, whereby a film is formed on the surface of the works 2.

At this time, the bias power source 20 is applied to the works 2. The rotating tables 11 are rotated by the drive means 13 to rotate the cylindrical works 2 around their axis, so that the outside surfaces of the works 2 are evenly opposed to the evaporation source 3. Cooling water as coolant is supplied to the coolant vessels 16 to cool the works 2 from the inside.

According to the above embodiment, by inserting the low-temperature coolant vessel 16 to the inside of the cylindrical work 2, the heat absorption from the inner surface of the work 2 which hardly contributed to radiation in the past can be performed. Further, since the coolant vessel 16 itself hardly receives a heat input from plasma or heater, the coolant sufficiently keeps a low temperature, and the ability of cooling the work 2 is thus never deteriorated. The work 2 is kept at 400° C. or lower by this cooling device 4.

Since the coolant vessel 16 is formed in a cylindrical shape fitted to the shape of the internal space 15 of the work 2, the seal structure with the ceiling part 6 is facilitated, and the deterioration in degree of vacuum within the vacuum chamber 1 can be minimized.

Namely, since the density of a heat medium (gas or ion particle) is extremely low in vacuum, the heat transfer from a material to a material almost depends on radiation except the case where the both are closely fitted to each other with a certain degree of area (conductive heat transfer). Accordingly, since there is little advantage in increasing the area by adapting a bellows type or fin structure as is used in a heat exchange which makes contact with a heat medium in the atmosphere or at a pressure over the atmospheric pressure, and a significant increase in surface area in vacuum adversely leads to the deterioration in degree of vacuum, the cylindrical coolant vessel 16 having a simple shape is preferably used for the cylindrical work 2.

The heat transfer rate by radiation between two materials is proportional to the area contributing to the heat transfer between the both. The space between the coolant vessel 16 and the inside surface of the work 2 is narrowed as much as possible, whereby the area of the coolant vessel 16 is more increased when seen up from the inner surface of the work 2, and the visible area of the inner surface of the high-temperature work 2 is reduced, and the cooling effect is thus enhanced.

When the distance between the both is zero, or the both are in contact to each other, a cooling by conductive heat transfer with a higher cooling effect can be expected. However, it is known that the remarkable cooling effect by conductive heat transfer can be obtained when the both are pressed at a pressure of 0.5–10 MPa, and it is a slightly special case that this can be realized. In actual operation, the easy attachment and detachment of the work 2 to the coolant vessel 16 is required in many cases. For a work 2 having a length of about 500 mm, for example, it would be better to provide a clearance of at least about 5 mm from the point of satisfactory workability, and this can still provide a sufficient cooling effect.

The work 2 may be simply placed on the rotating table 11 without being fixed thereto while preventing its falling by the coolant vessel 16. In this case, the coolant vessel 16 functions as a work holding jig.

When the evaporated material from the evaporation source 3 flies to the work 2 from a certain specified direction, it is deposited thicker on the side facing the evaporation source 3. However, by rotating the work 2, the evaporated material can be deposited in a uniform thickness over the whole circumference while cooling the work 2.

Figure 3:
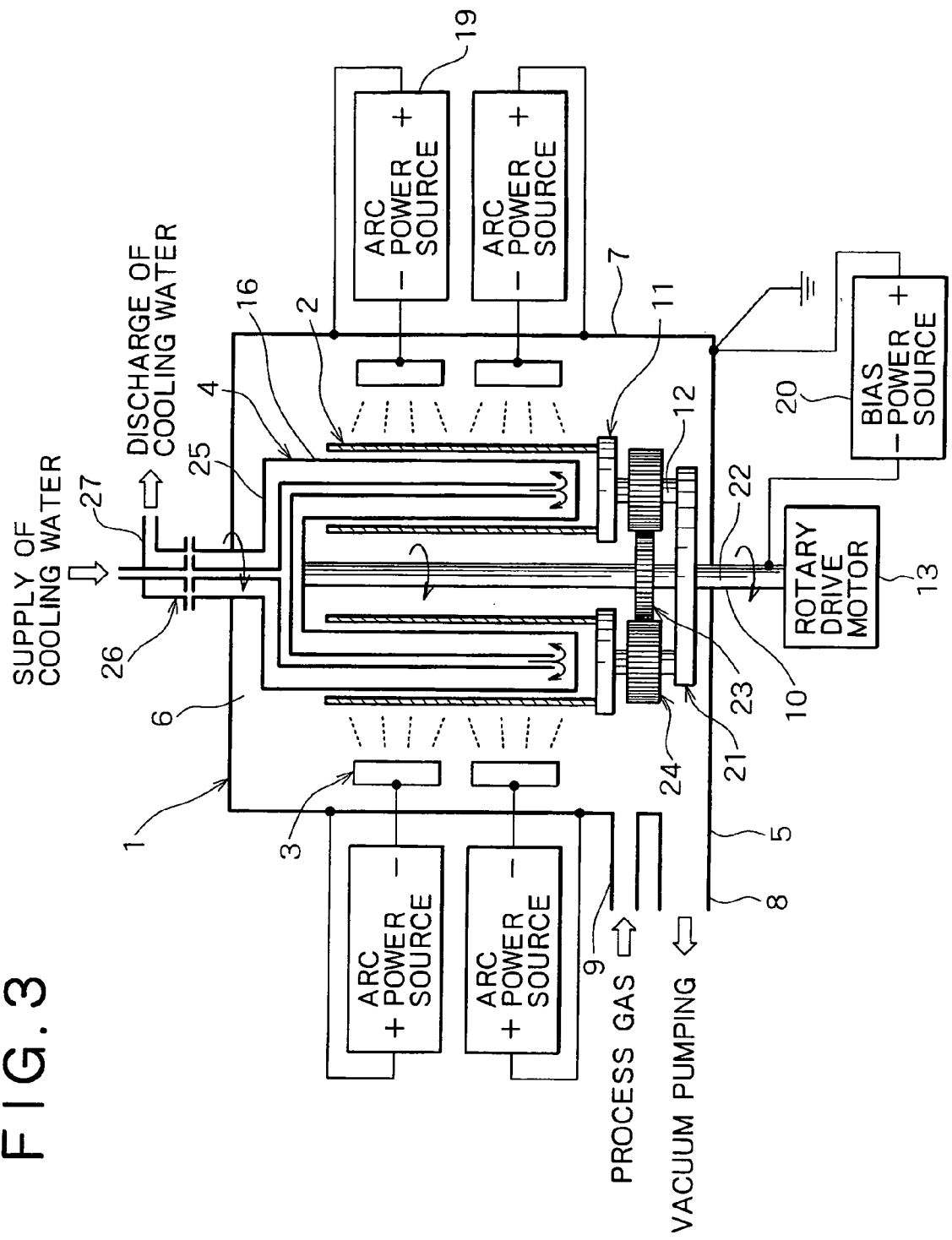
FIG. 3 is a schematic view showing another embodiment of the present invention.

Another embodiment of the present invention is shown in FIG. 3.

In this embodiment, the work holding device 10 is constituted so as to move the work 2 in a direction different from the rotating direction. Namely, the work holding device 10 has a moving means 21 for moving the work 2 separately from the rotating table 11. The coolant vessel 16 is provided so as to move following the movement of the work 2 by the moving means 21.

Namely, the work holding device 10 has a revolving table as the moving means 21, and the rotating shafts 12 of the rotating tables 11 are rotatably provided on the revolving table 21. The revolving table 21 has a revolving shaft 22, and the revolving shaft 22 is rotatably supported by the bottom part 5 to be concentric with the axis of the cylindrical vacuum chamber 1. The revolving shaft 22 has a sun gear 23. Planet gears 24 are meshed with the sun gear 23, and the planet gears 24 are fixed to the rotating shafts 12. The revolving shaft 22 is rotated by a drive means 13.

A plurality of evaporation sources 3 is arranged at circumferentially equal intervals on a concentric circle with the axial center of the revolving shaft 22 so as to surround the work holding means 10. The evaporation sources 3 are vertically arranged in a plurality of stages (two stages in this embodiment).

The cooling device 4 has a coolant vessel holding part 25 rotatably supported by the ceiling part 6 of the vacuum chamber 1 concentrically with the revolving shaft 22.

The coolant vessels 16 are suspended from the coolant vessel holding part 25 so as to be opposed to the rotating tables 11 in the same position. The upper part of the coolant vessel holding part 25 is protruded upward from the ceiling part 6 of the vacuum chamber 1, and a coolant supply and discharge part 27 is connected to the protruded part through a rotary joint 26.

The ceiling part 6 and circumferential wall part 7, or circumferential wall part 7 and bottom part 5 of the vacuum chamber 1 are provided to be vertically relatively movable, so that the works 2 can be placed on the rotating tables 11 when the both are separated, and the coolant vessels 16 can be inserted to the internal spaces 15 of the works 2 when the both are closely bonded. The revolving shaft 22 and the coolant vessel holding part 25 are engageably and disengageably connected, so that each coolant vessel 16 performs the same rotation as the revolving shaft 22.

Other structures are the same as those shown in FIGS. 1 and 2.

According to the embodiment having the above-mentioned structure, since the works 2 are rotated and also revolved, they are uniformly opposed to the evaporation sources 3, and a uniform film deposition can be attained.

At this time, since the cooling device 4 is also moved following the revolution, the works 2 can be effectively cooled. Since the supply and discharge of the coolant is performed through the one coolant supply and discharge part 27, the piping system can be simplified.

Figure 4:
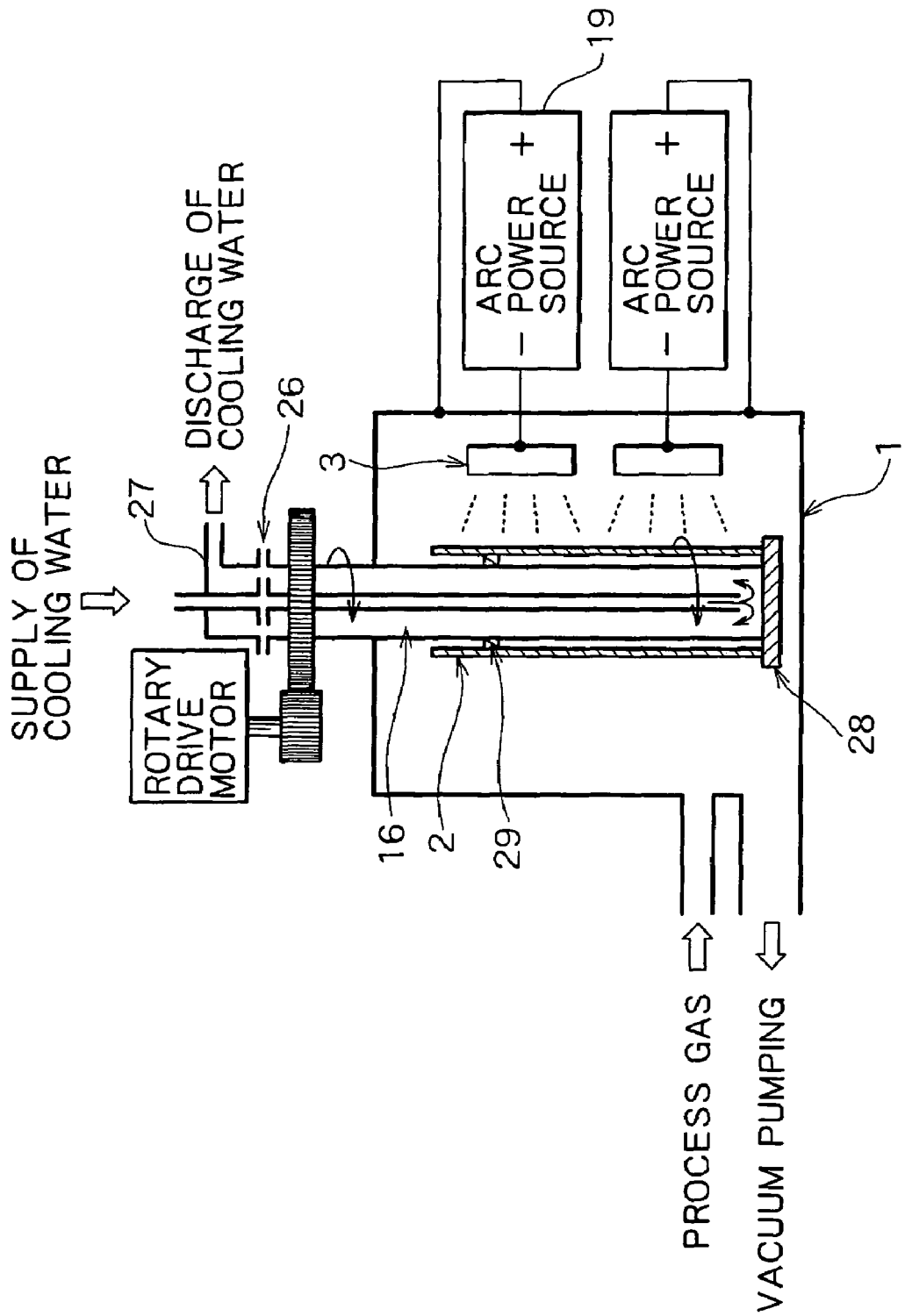
FIG. 4 is a schematic view showing further another embodiment of the present invention.

Another embodiment of the present invention is further shown in FIG. 4.

The coolant vessel 16 of the cooling device 4 is rotatably supported by the ceiling part 6. The coolant vessel 16 is rotatable around its axis by a drive means 13. The upper end part of the coolant vessel 16 is connected to the coolant supply and discharge part 27 through the rotary joint 26.

The work holding device 10 is formed of a work holding tool 28 provided at the lower end of the coolant vessel 16 and a spacer 29 provided in the middle part of the coolant vessel 16.

The cylindrical work 2 is placed on the upper surface of the work holding tool 28, and concentrically positioned by the spacer 29. Since the work 2 is rotated according to the rotation of the coolant vessel 16 by the drive means 13, the work holding tool 28 has the same function as the rotating table 11.

The evaporation sources 3 are arranged on one side of the work 2. Other structures are the same as in the above-mentioned another embodiment.

Figure 5:
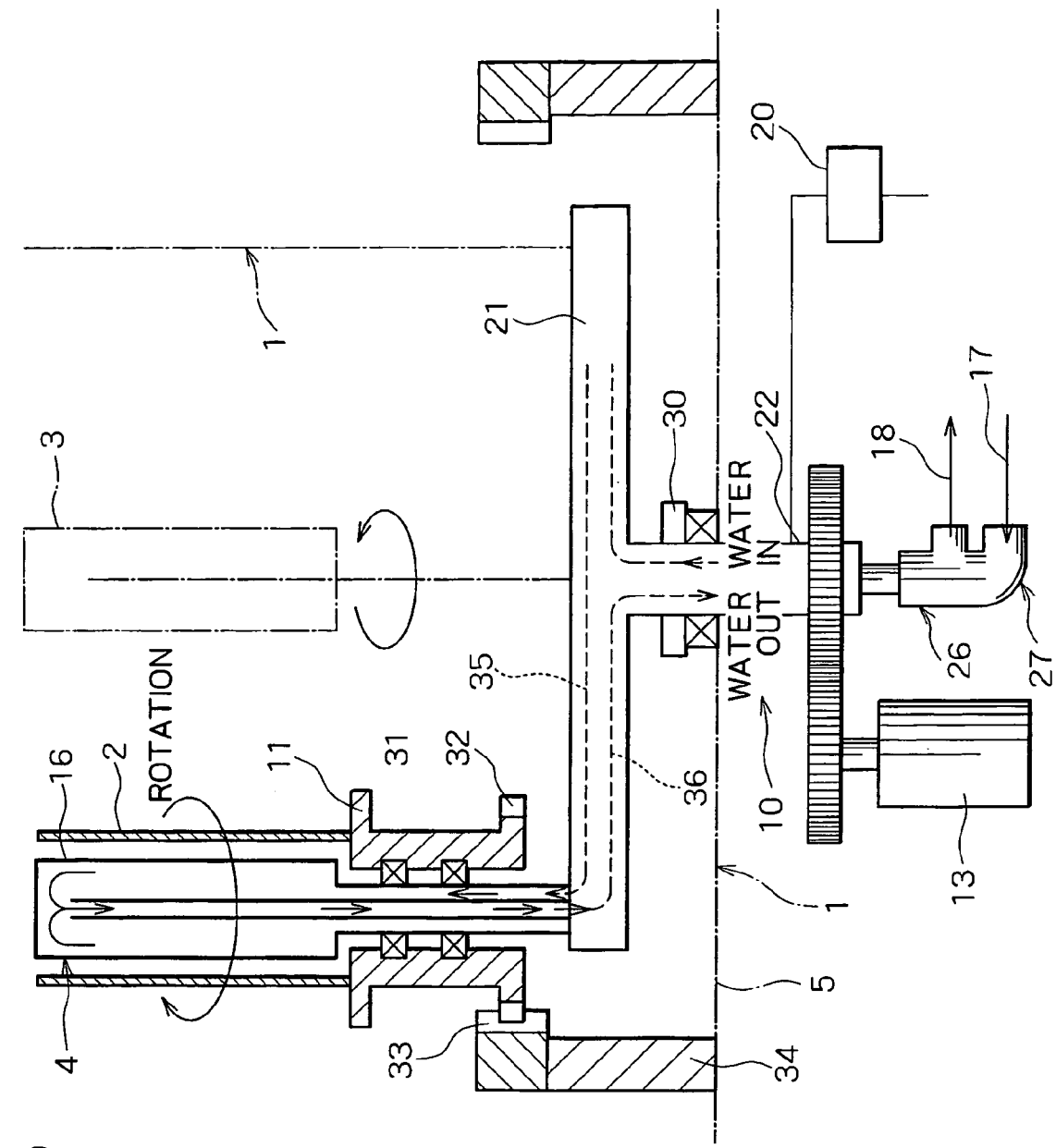
FIG. 5 is a schematic view showing the other embodiment of the present invention.
Figure 6:
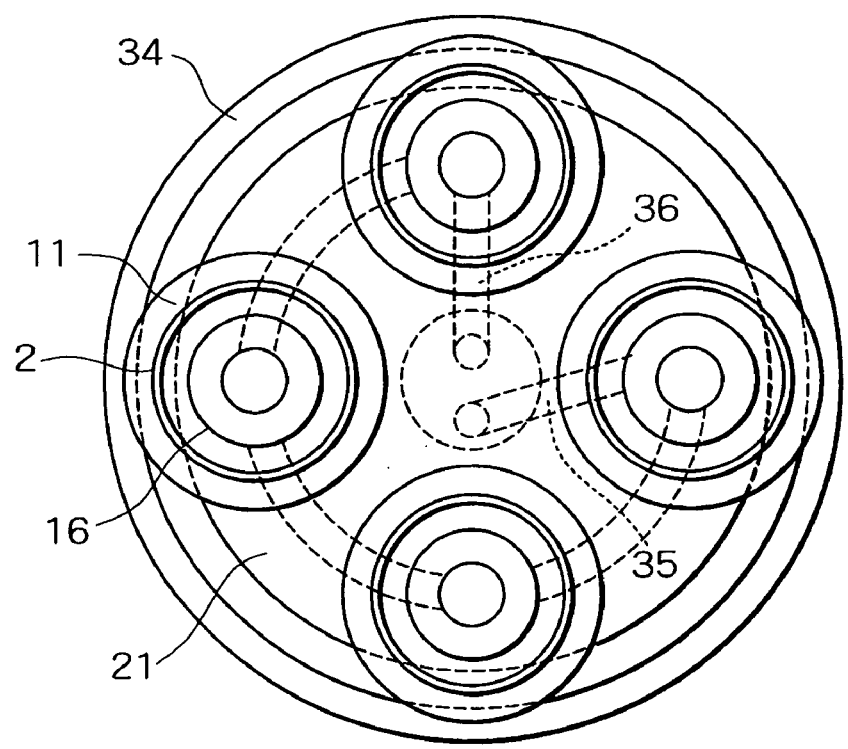
FIG. 6 is a top plane view of the system of FIG. 5.

Further, the other embodiment of the present invention is shown in FIGS. 5 and 6.

In this embodiment, the cooling devices 4 are provided on the work holding device 10.

Namely, the revolving shaft 22 of the revolving table 21 of the work holding device 10 is rotatably supported by the bottom part 5 of the vacuum chamber 1 through a vacuum seal insulation 30. The lower end of the revolving shaft 22 is interlocked and connected to the motor of the drive means 13 through a gear.

The cylindrical coolant vessels 16 of the cooling devices 4 are fixed to the upper surface of the revolving table 21 to have circumferentially equal intervals on a concentric circle with the axis of the revolving shaft 22 in a vertical axis attitude.

The rotating table 11 is rotatably supported by the lower part of the cooling vessel 16 through a bearing of bearing means 31. The upper surface of the rotating table 11 is a mounting surface for the cylindrical work 2. A small gear 32 is formed in the lower part of the rotating table 11. A large gear 33 having internal teeth to be meshed with the small gear 32 is provided on the bottom part 5 of the chamber 1 concentrically with the axis of the revolving shaft 22 through an insulating material 34.

The coolant supply and discharge part 27 is provided on the lower end of the revolving shaft 22 through the rotary joint 26. The coolant supplied from the coolant supply and discharge part 27 is supplied and circulated to the coolant vessels 16 through a coolant supply passage 35 formed in the revolving shaft 22 and the revolving table 21, and then discharged from the coolant supply and discharge part 27 through a coolant discharge passage 36 formed in the revolving table 21 and the revolving shaft 22.

The bias power source 20 is connected to the revolving shaft 22 to apply the cathode of the bias power source 20 to the works 2 on the rotating tables 11.

In the above structure, the evaporation source 3 is preferably provided on the revolving shaft center part. However, it can be provided on the circumferential area as shown in FIG. 3. Otherwise, the evaporation sources 3 may be provided on both the central part and the circumferential area.

According to the above structure, since the cooling device 4 is used also as the work holding device 10, the work 2 is placed on the rotating table 11, whereby the cooling device 4 can be also simultaneously set, and the setting time of work can be shortened.

In this embodiment, since the work 2 can be charged from above, the charging of works is facilitated.

Since the work holding device 10 has the coolant passages 35 and 36, the work holding device 10 itself can be cooled to effectively cool the lower part of the work.

In the system with the rod-like evaporation source 3 arranged in the center, the diffusing state of particles evaporated form the rod type evaporation source 3 is not circumferentially uniformed because the structure of the chamber (positive electrode) 1 or the like is not strictly axially symmetric to the central axis of the evaporation source 3. Therefore, a dispersion in film thickness of at least several percentages is observed among works (among rotating shafts) in the embodiment of FIG. 1. However, since the works 2 are rotated and revolved around the evaporation source 3 in the embodiment shown in FIG. 5, the dispersion in film thickness among works can be solved.

Further, since each setting position of the drive shaft for the works 2 and the supply and discharge part of cooling water is only one, the reliability of vacuum seal that is important for a vacuum device is improved. The feeding mechanism of bias voltage can be also simplified.

Figure 7A:
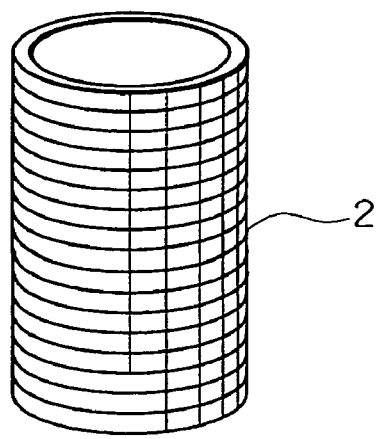
FIGS. 7(a) and (b) are perspective views showing various shapes of works.
Figure 7B:
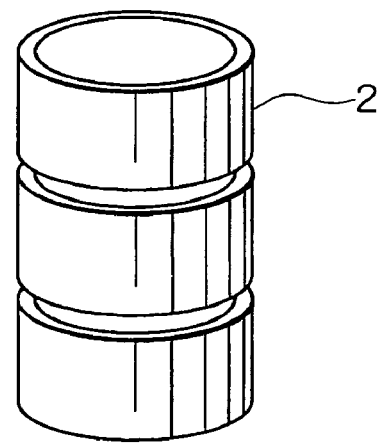

Various shapes of the works 2 usable in the system of the present invention are shown in FIGS. 7(a) and 7(b). FIG. 7(a) shows a vertically laminated and integrated body of ring-like piston rings, and FIG. 7(b) shows a cylindrical body axially divided into a plurality of pieces. Such works are usable as cylindrical works in the system of the present invention.

EXAMPLE

An example of film deposition using the system shown in FIGS. 1 and 2 is described.

Work: Cylindrical body with outer diameter 90 mm, thickness 3 mm, and height 600 mm Coolant vessel: Material SUS; Coolant 27° C.-water Deposition condition: Arc current 500A×2; Bias voltage 15V; Gas (nitrogen) pressure 3 Pa The temperatures of the work 2 when changing the clearance between the work 2 and the coolant vessel 16 and when using no coolant vessel 16 were compared under the common condition described above. The temperature measurement was carried out after 2 hours from electric discharge start where the work temperature is sufficiently laid in a steady state. The experiment results are shown in Table 1.

TABLE 1

| Clearance between work and coolant vessel | Work temp. (° C.) |
| --- | --- |
| No coolant vessel | 497 |
| 30 mm | 408 |
| 20 mm | 384 |
| 10 mm | 371 |
| 5 mm | 366 |
| 1 mm | 363 |

According to Table 1, the work temperature that was a little less than 500° C. with no coolant vessel is largely reduced to a little more than 400° C. at a clearance of 30 mm and to about 360° C. at a clearance of 5 mm or less between the work and coolant vessel, which is practically sufficient.

Accordingly, the clearance between the inside surface of the work and the outside surface of the coolant vessel is preferably set to 100 mm or less, desirably 30 mm or less and 5 mm or more.

The present invention is never limited by those shown in the above embodiments, and can be applied to not only the vacuum arc deposition method but also other PVD methods. The work is not limited in shape to the cylindrical shape, and any one that has an internal space allowing the insertion of the cooling device can be used. Even in a substantial work having no internal space, a film deposition can be performed while performing the same cooling as a hollow member depending on the arrangement.

What is claimed is:

1. A film deposition system comprising:
a vacuum chamber;
an evaporation source for forming a film on a work in said vacuum chamber;
a cylindrical cooling vessel having an outside surface and being adapted to circulate therein a coolant for cooling the work, said cooling vessel being provided within said vacuum chamber, wherein the work has a cylindrical internal space communicating with the outside through an opening part, and said cooling vessel is insertable axially into and drawable from the cylindrical internal space through the opening part of the work to cool the work from the inside; and
a member positioned to maintain the cylindrical cooling vessel concentrically positioned within said work.

2. The film deposition system according to claim 1, wherein the member maintains a clearance between the inside surface of the work and the outside surface of said coolant vessel of 100 mm or less.

3. The film deposition system according to claim 1, further comprising a work holding device for attachably and detachably holding the work, said work holding device comprising a rotating table for rotating the work around a rotating shaft that is the axis of the internal space.

4. The film deposition system according to claim 3, wherein said work holding device has a moving means for moving the work separately from said rotating table, and said cooling vessel is provided so as to move following the movement of the work by said moving means.

5. The film deposition system according to claim 4, wherein said moving means has a revolving table rotated around a revolving shaft, and said rotating table is provided on said revolving table.

6. The film deposition system according to claim 5, wherein said coolant vessel is provided on said revolving table.

7. The film deposition system according to claim 6, wherein said vacuum chamber has a bottom part, said revolving table is provided on the bottom part with the revolving shaft as a vertical axis attitude, said rotating table is provided on the upper surface of said revolving table to have circumferentially equal intervals on a concentric circle with the revolving shaft as center, and said coolant vessel is provided on the rotating shaft center part.

8. The deposition system according to claim 1, wherein a plurality of works is arranged on the circumference of the concentric circle, and the cooling vessel is arranged in the center part of the concentric circle.

9. The film deposition system according to claim 1, wherein the member maintains a clearance between the inside surface of the work and the outside surface of said coolant vessel of 30 mm or less.

10. The film deposition system according to claim 1, wherein the member comprises a spacer positioned between the outside surface of said cylindrical cooling vessel and the inside surface of said work.

11. A film deposition system comprising:

a vacuum chamber;

a cylindrical cooling vessel having an outside surface and being adapted to circulate therein a coolant for cooling the work, said cooling vessel being provided within said vacuum chamber, wherein the work has a cylindrical internal space communicating with the outside through an opening part, and said cooling vessel is insertable axially into and drawable from the cylindrical internal space through the opening part of the work to cool the work from the inside; and a work holding device for attachably and detachably holding the work, said work holding device comprising a rotating table for rotating the work around a rotating shaft that is the axis of the internal space, wherein said work holding device has a moving means for moving the work separately from said rotating table, and said cooling vessel is provided so as to move following the movement of the work by said moving means.

* * * * *

UNITED STATES PATENT AND TRADEMARK OFFICE
CERTIFICATE OF CORRECTION

PATENT NO. : 7,150,792 B2
APPLICATION NO. : 10/681345
DATED : December 19, 2006
INVENTOR(S) : Fujii et al.

It is certified that error appears in the above-identified patent and that said Letters Patent is hereby corrected as shown below:

On the title page, Item (73), the Assignee Information is incorrect. Item (73) should read:

-- (73) Assignee: Kabushiki Kaisha Kobe Seiko Sho (Kobe Steel, Ltd.) Kobe (JP)--

Signed and Sealed this

Sixth Day of March, 2007

JON W. DUDAS
*Director of the United States Patent and Trademark Office*